US011705148B2

(12) United States Patent
Ibrahim et al.

(10) Patent No.: US 11,705,148 B2
(45) Date of Patent: Jul. 18, 2023

(54) ADAPTIVE COEFFICIENTS AND SAMPLES ELIMINATION FOR CIRCULAR CONVOLUTION

(71) Applicant: MICROSOFT TECHNOLOGY LICENSING, LLC, Redmond, WA (US)

(72) Inventors: Ziyad Ibrahim, Redmond, WA (US); Laxmi Narsimha Rao Kakulamarri, Redmond, WA (US); Andrew Yi Jiang, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 17/500,893

(22) Filed: Oct. 13, 2021

(65) Prior Publication Data

US 2022/0399029 A1 Dec. 15, 2022

Related U.S. Application Data

(60) Provisional application No. 63/209,942, filed on Jun. 11, 2021.

(51) Int. Cl.
*G10L 21/0332* (2013.01)
*G10L 19/022* (2013.01)
(Continued)

(52) U.S. Cl.
CPC ........ *G10L 21/0332* (2013.01); *G10L 19/022* (2013.01); *G10L 21/007* (2013.01); *H04S 7/301* (2013.01)

(58) Field of Classification Search
None
See application file for complete search history.

(56) References Cited

U.S. PATENT DOCUMENTS 6,519,342 B1 * 2/2003 Opitz ................. H03H 17/0223
                                                     381/61
9,805,704 B1 * 10/2017 Abel ........................ G10H 5/02
(Continued)

OTHER PUBLICATIONS

C. Schissler, C. Loftin and D. Manocha, "Acoustic Classification and Optimization for Multi-Modal Rendering of Real-World Scenes," in IEEE Transactions on Visualization and Computer Graphics, vol. 24, No. 3, pp. 1246-1259, Mar. 1, 2018, doi: 10.1109/TVCG.2017.2666150. (Year: 2018).*

(Continued)

*Primary Examiner* — Shaun Roberts
(74) *Attorney, Agent, or Firm* — David W. Foster; Newport IP, LLC

(57) ABSTRACT

Technologies are disclosed for improving the efficiency of real-time audio processing, and specifically for improving the efficiency of continuously modifying a real-time audio signal. Efficiency is improved by reducing memory bandwidth requirements and by reducing the amount of processing used to modify the real-time audio signal. In some configurations, memory bandwidth requirements are reduced by selectively transferring active samples in the frequency domain—e.g. avoiding the transfer samples with amplitudes of zero or near-zero. This has particular importance when the specialized hardware retrieves samples from main memory in real-time. In some configurations, the amount of processing needed to modify the audio signal is reduced by omitting operations that do not meaningfully affect the output audio signal. For example, a multiplication of samples may be avoided when at least one of the samples has an amplitude of zero or near-zero.

20 Claims, 14 Drawing Sheets

(51) Int. Cl.
*G10L 21/007* (2013.01)
*H04S 7/00* (2006.01)

(56) References Cited

U.S. PATENT DOCUMENTS

| | | | |
|---|---|---|---|
| 2006/0045294 A1 | 3/2006 | Smyth | |
| 2009/0052692 A1* | 2/2009 | Wang | H04S 7/301 |
| | | | 381/94.3 |
| 2009/0133566 A1* | 5/2009 | Nakae | G10H 1/0091 |
| | | | 84/603 |
| 2011/0081023 A1 | 4/2011 | Raghuvanshi et al. | |
| 2018/0182365 A1* | 6/2018 | Sakata | G10H 1/125 |
| 2020/0322750 A1* | 10/2020 | Neukam | G10L 19/008 |
| 2021/0201931 A1* | 7/2021 | Wang | G10L 25/84 |

OTHER PUBLICATIONS

"International Search Report and Written Opinion Issued in PCT Application No. PCT/US22/028666", dated Sep. 6, 2022, 14 Pages.

\* cited by examiner

ADAPTIVE COEFFICIENTS AND SAMPLES ELIMINATION FOR CIRCULAR CONVOLUTION

PRIORITY APPLICATION

The present application is a non-provisional application of, and claims priority to, the earlier filed U.S. Provisional Application Ser. No. 63/209,942 filed on Jun. 11, 2021, the contents of the listed application are hereby incorporated by reference in their entirety.

BACKGROUND

Audio is integral to many computing applications, such as video games, conference calls, and multimedia players. These applications will often enhance, manipulate, or otherwise modify an audio signal. For example, a conference call application may better reproduce an in-person experience by utilizing three-dimensional audio to project the voices of different participants to different locations. A video game may enhance realism by adding effects such as echo, muffle, or being underwater. Multimedia players may tailor an audio signal based on the amplifier and speakers that will ultimately generate the sound. However, applying these modifications to an audio signal is computationally expensive.

Existing techniques for modifying an audio signal utilize specialized hardware. For example, a video game console may include specialized hardware that applies different audio effects in real-time based on the in-game environment. However, even with hardware acceleration, there are memory bandwidth and processing constraints that affect the latency and throughput of modifying an audio signal. For example, when a video game utilizes a large number of effects, it may be impractical to store the data used to perform each effect local to the specialized hardware. To address this, the data will often be transferred from main memory to the specialized hardware in real-time, increasing latency.

Specialized audio processing hardware may also be limited by processing capacity. Some audio processing systems may not have the processing capacity to modify high resolution audio formats or to apply multiple effects at the same time. Other audio processing systems may be able to perform a computationally intense modification, but at the expense of quality, latency, or some other criteria. Still other specialized audio processing hardware may be designed with increased hardware resources to compensate for less efficient algorithms, increasing the cost, complexity, and energy consumption of the hardware.

It is with respect to these and other technical challenges that the disclosure made herein is presented. The subject matter claimed herein is not limited to embodiments that solve any disadvantages or that operate only in environments such as those described above. Rather, this background is only provided to illustrate one exemplary technology area where some embodiments described herein may be practiced.

SUMMARY

Technologies are disclosed for improving the efficiency of real-time audio processing, and specifically for improving the efficiency of continuously modifying a real-time audio signal. Efficiency is improved by reducing memory bandwidth requirements and by reducing the amount of processing used to modify the real-time audio signal. In some configurations, memory bandwidth requirements are reduced by selectively transferring active samples in the frequency domain—e.g. avoiding the transfer samples with amplitudes of zero or near-zero. This has particular importance when the specialized hardware retrieves samples from main memory in real-time. In some configurations, the amount of processing needed to modify the audio signal is reduced by omitting operations that do not meaningfully affect the output audio signal. For example, a multiplication of samples may be avoided when at least one of the samples has an amplitude of zero or near-zero.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

The technologies disclosed herein provide for technical improvements in the processing of digital audio signals. As described briefly above, adding an effect to, or otherwise modifying a real-time audio signal is memory bandwidth and processing intensive. The increasing demands of ever more complex video games and higher-fidelity audio standards has strained existing techniques. Also, increasing concern over power consumption and the environmental impact of computing devices has increased interest in improving the efficiency of these devices. This problem is particular to the domain of software and computer engineering, as it addresses problems unique to using a computing device to modify an audio signal that is generated by a computing device.

To address this technological challenge, and potentially others, data that meaningfully impacts the output audio signal is selected to be transferred from main memory to a local memory of a specialized audio processing hardware component. At the same time, data that does not meaningfully impact the output audio signal is skipped, optimizing the use of memory bandwidth.

The constraints on processing power may be alleviated in some embodiments by skipping computations that are expected to have little to no impact on the output audio signal. For instance, samples may be identified that, when included in an audio convolution computation, cause the computation to have little to no impact on the output audio signal. As one example, computations that multiply a sample with a zero or near-zero amplitude have little to no impact on the output audio signal, and so these computations may be skipped.

Patterns may be identified and leveraged to infer whether a computation involving a particular sample will impact the output audio signal. For example, within an input block, samples above a threshold frequency tend to have zero or near-zero amplitudes. Another pattern is observed between successive blocks in the frequency domain—amplitudes begin lower and converge towards zero sooner the further a block is to the right. Based on these patterns, computations may be omitted for samples based on an index of the sample. Additional details regarding these aspects and others will be provided below with regard to the several FIGS.

Figure 1:
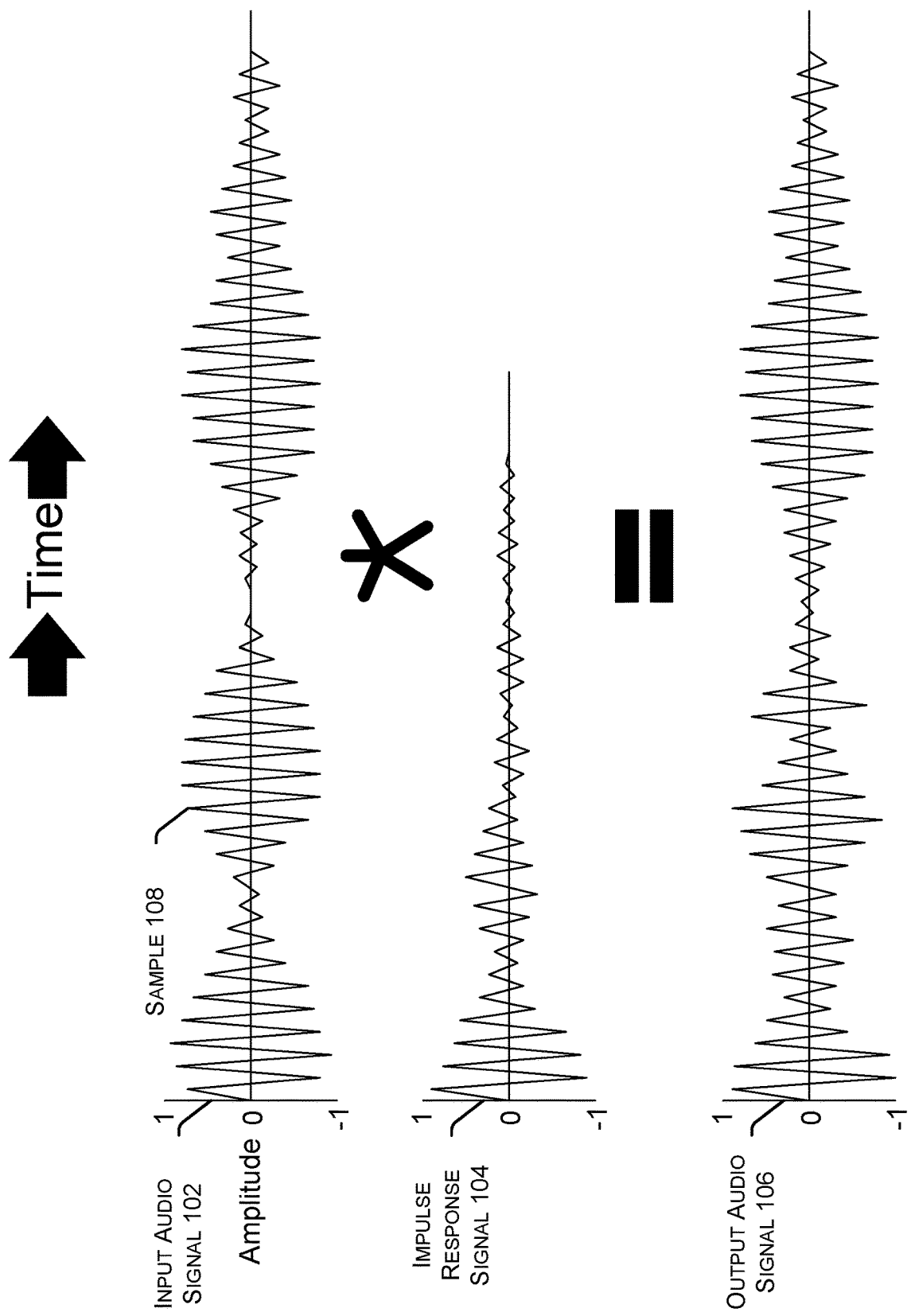
FIG. 1 illustrates convolving an input audio signal with an impulse response signal to generate an output audio signal.

FIG. 1 illustrates applying an impulse response signal 104 to an input audio signal 102. The result is output audio signal 106, which represents input audio signal 102 having applied the effect encoded by impulse response signal 104. Impulse response signal 104 may be applied in real-time or near real-time. As such, any delay in applying impulse response signal 104 may cause a lag in audio output, which may significantly degrade an end-user's audio experience.

Input audio signal 102 may represent audio generated by a video game, an audio synthesizer, or any other type of computer-generated audio. Input audio signal 102 may also represent audio that has been recorded and reproduced, e.g. by a conference call application. One example of an impulse response signal 104 is a signal that encodes how audio is experienced in a particular environment, such as in a forest, in a large building, in a car, or while diving under water. For example, a video game may generate the sound of footsteps as an avatar navigates a virtual world. When the avatar enters a cathedral, the video game may apply an impulse response signal 104 that causes the sound of footsteps to seem as if they were made within a cathedral. If the avatar leaves the cathedral, the impulse response signal of being within a cathedral may be replaced with a different impulse response signal. As discussed above, audio effects applied to a video game is just one example of impulse response signal 104. Other real-time modifications of input audio signal 102 are similarly contemplated, such as generating 3D audio, customizing audio for specific sound systems, removing pips, hisses, and other imperfections, and the like.

Each sample 108 of input audio signal 102 encodes the amplitude of sound that was recorded (or generated) at that particular point in time. As such, input audio signal 102 is said to be encoded in a time domain—i.e. the x-axis represents time, and the y-axis represents volume. As illustrated, amplitude may optionally be normalized to a value between −1 and 1.

Impulse response signal 104 may be generated by sampling multiple sounds in a particular environment, and isolating the effect caused by being in that environment. For example, multiple microphones setup in multiple locations within a cathedral may be used to record a sound generated in the cathedral. Once an effect is encoded as an impulse response signal, it may then be applied to arbitrary audio signals to simulate sound within a cathedral.

Figure 2:
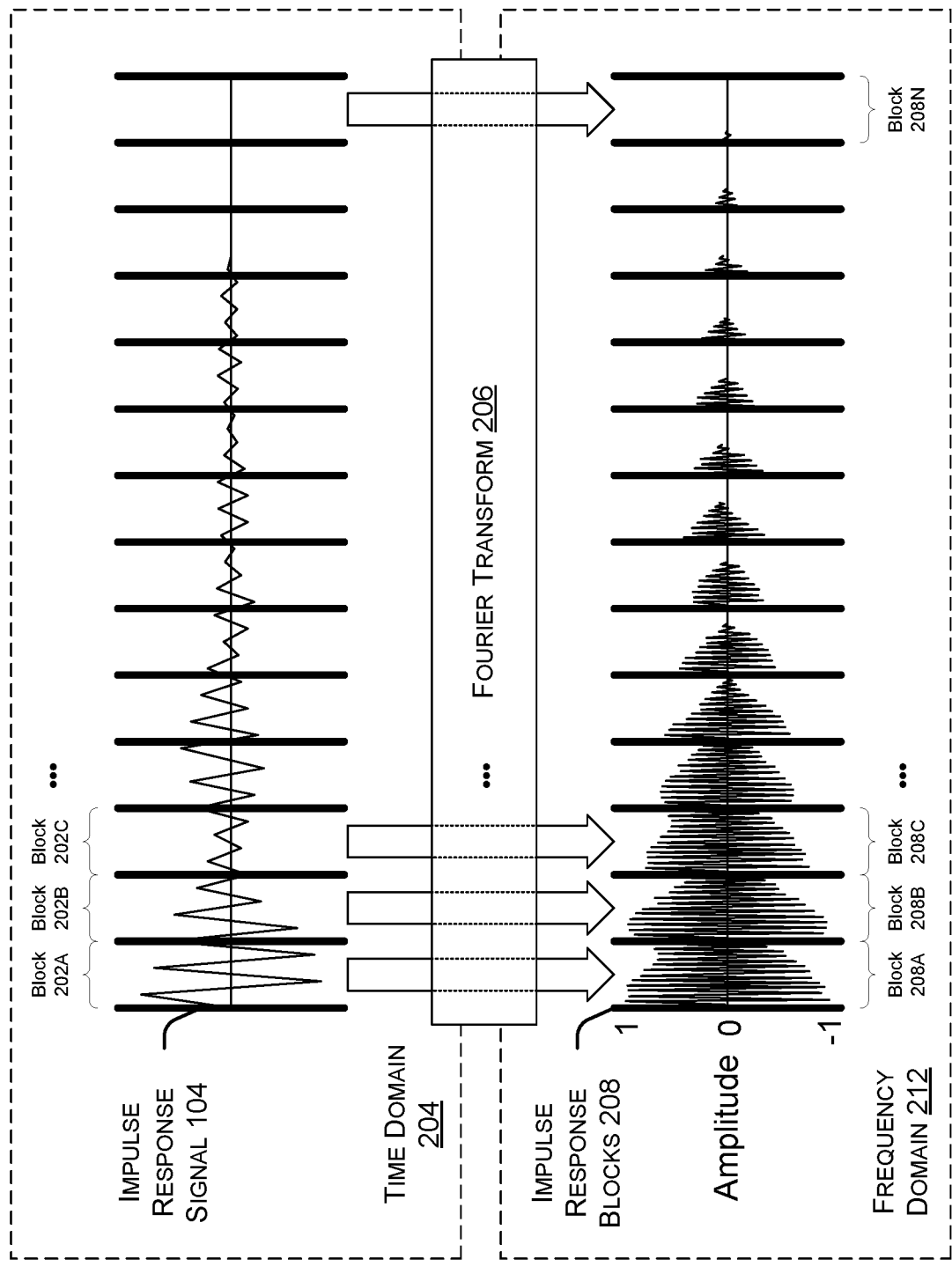
FIG. 2 illustrates transforming an impulse response signal from the time domain to the frequency domain.

FIG. 2 illustrates transforming the impulse response signal 104 from the time domain 204 to the frequency domain 212. As discussed above, audio encoded in time domain 204 is stored as a series of sound samples at different points in time. The amplitude of each sample indicates the volume of sound recorded at that point in time. In contrast, frequency domain 212 encodes sound by storing how much of each frequency of sound was recorded. Instead of representing time, the x-axis in frequency domain 212 represents frequency, starting on the left with a lowest frequency and increasing to the right. In the frequency domain 212, each sample may represent how much sound of a range of frequencies was recorded. For example, a frequency domain may divide the frequencies recorded into 512 intervals, such that each sample represents the amount of sound recorded from $\frac{1}{512}^{th}$ of the total frequency range.

Impulse response signal 104 is divided into blocks 202A, 202B, 202C, etc., where each block contains signal data from a portion of the impulse response signal 104. Then, Fourier Transform 206 is applied individually to block 202s, generating impulse response block 208s. Specifically, Fourier Transform 206 is applied to each block 202 in time domain 204 to generate a corresponding block 208 in the frequency domain 212. One of ordinary skill in the art would appreciate that a Fourier Transform generates real-value and imaginary-value sets of impulse response blocks, but that for brevity they are referred to as a single set of impulse response blocks 208.

One of ordinary skill in the art would appreciate that a Fast Fourier Transform (FFT) is a preferred way of performing these transformations, but that any technique that achieves a similar result is also contemplated. If an FFT is utilized, then the size of each block—i.e. the number of samples in each block—will be a power of two, with common values of 512 and 1024.

In some configurations, the transformation to the frequency domain may take place ahead of time, improving latency. For example, impulse response signal 104 may be split into blocks 202 and transformed into impulse response blocks 208 at compile time, at application load time, or at any other time before they are requested for real-time use.

Figure 3:
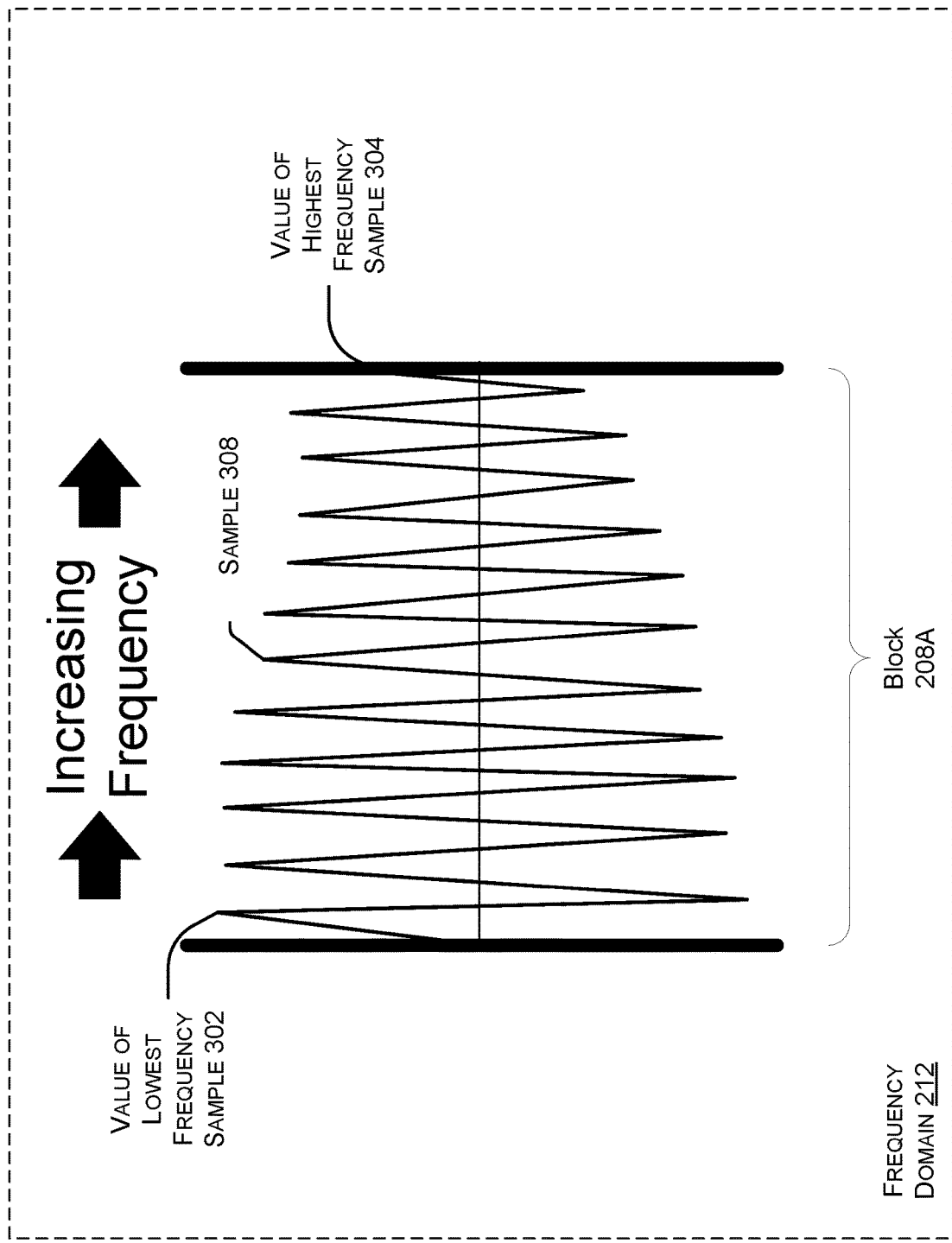
FIG. 3 illustrates aspects of an impulse response block.

FIG. 3 illustrates aspects of an impulse response block 208. In some configurations, the amplitudes of samples illustrated in block 208A indicate the amount of audio within a frequency range. Specifically, as discussed above in conjunction with FIG. 2, each block 208 is divided into intervals, each of which represents a range of frequencies. For example, if block 208A is divided into 512 sub-sections between lowest frequency 302 and highest frequency 304, then the amplitude of each sample 308 of block 208A will indicate the amount of sound within $\frac{1}{512}^{th}$ of the total frequency range.

Figure 4:
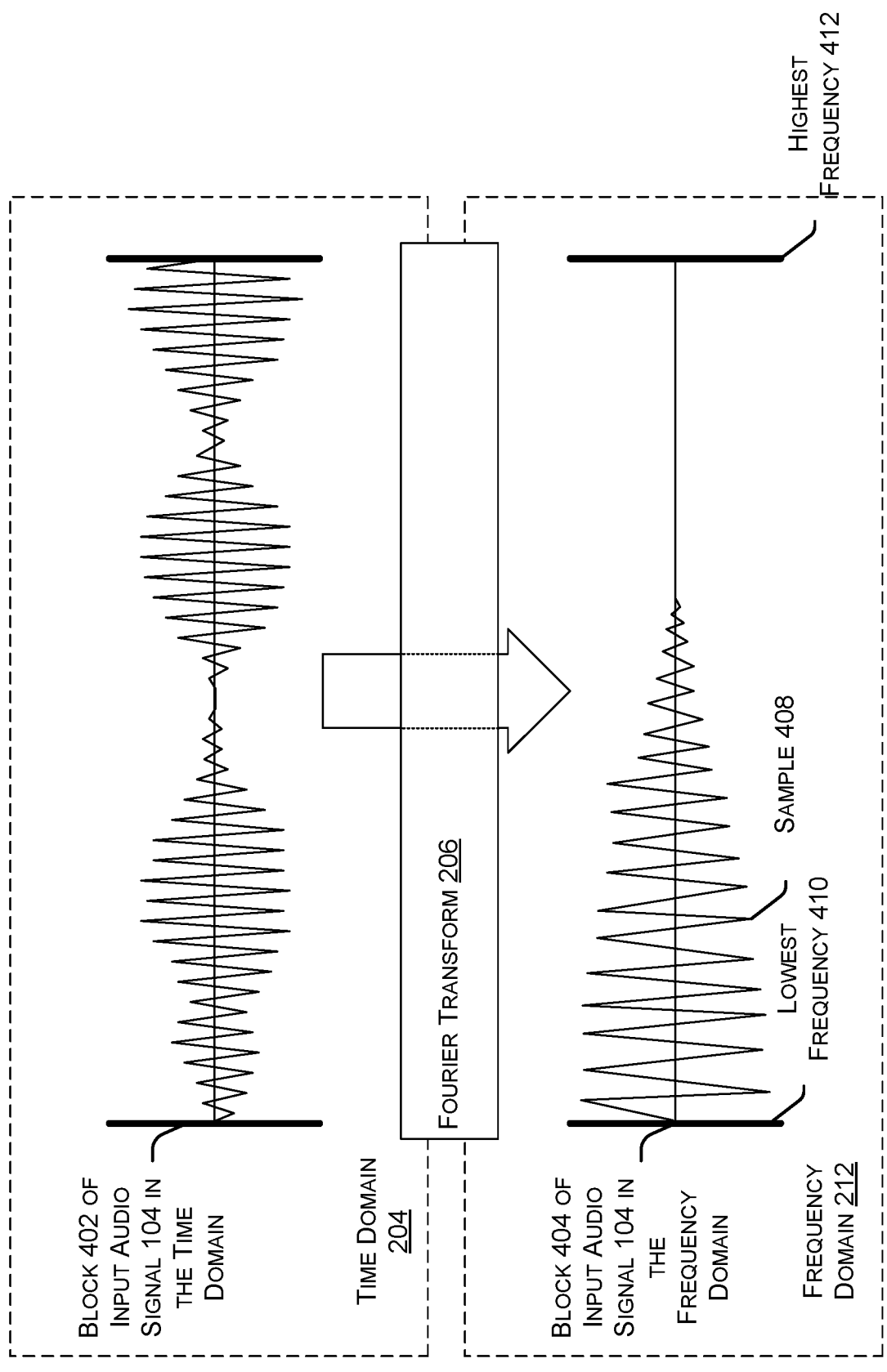
FIG. 4 illustrates applying a Fourier Transform to convert an input audio signal from the time domain to the frequency domain.

FIG. 4 illustrates applying Fourier Transform 206 to convert block 402 of input audio signal 104 from the time domain 204 to the frequency domain 212. The result is block 404 of input audio signal 104, which includes frequency samples 408 that indicate the amount of sound at different frequencies for the period of time represented by block 402. The frequencies are ordered and range from a lowest frequency 410 to a highest frequency 412. In some configurations, real-time audio is generated one block at a time. For example, input audio signal 102 may be generated one block at a time by a video game console. Once the audio represented by block 402 is transformed to block 404 in the frequency domain, impulse response blocks 208 may be applied to add an effect or other modification.

Figure 5:
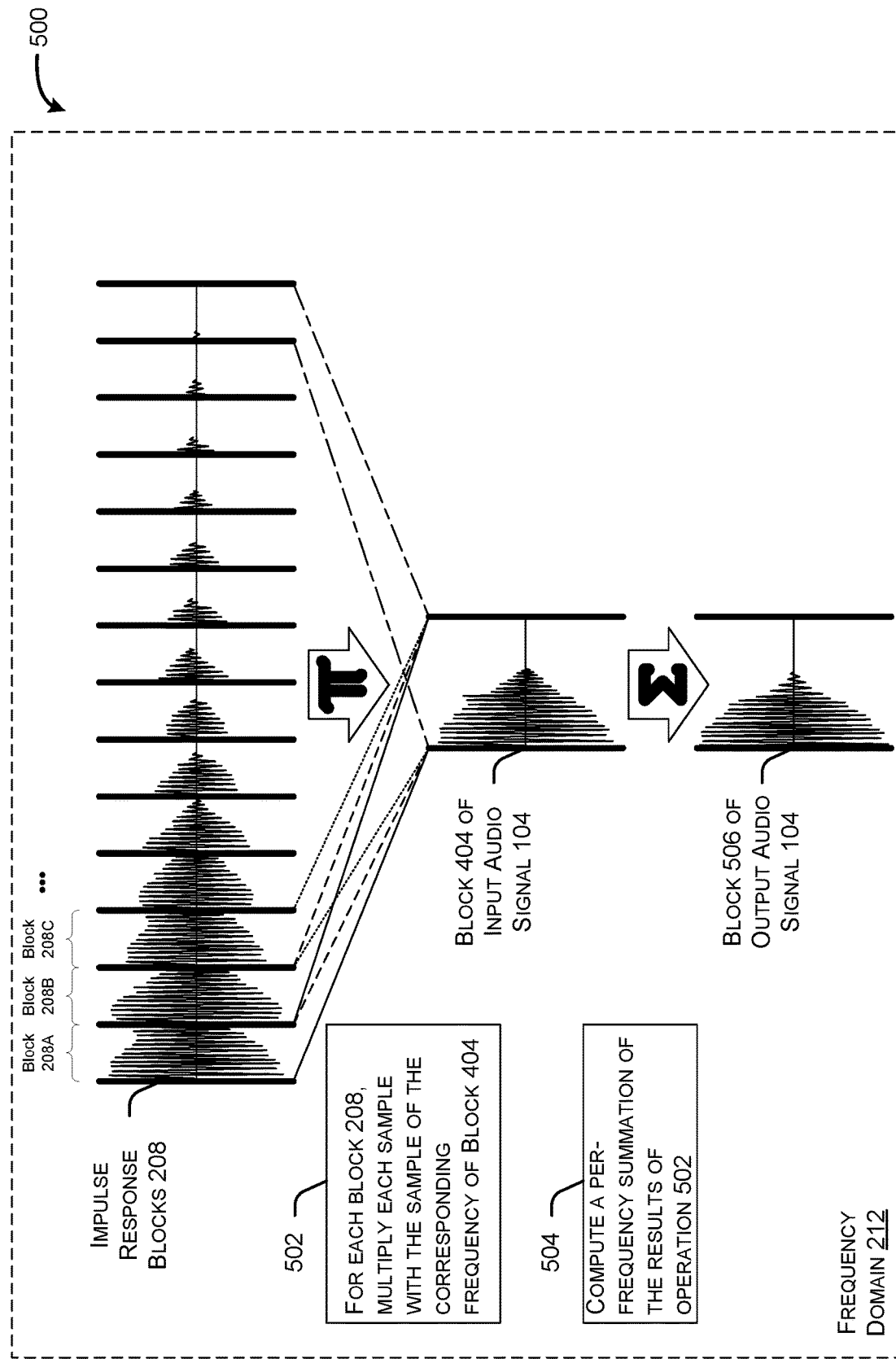
FIG. 5 illustrates applying multiple impulse response blocks to a single input audio block to generate an output audio block.

FIG. 5 illustrates applying a number of impulse response blocks 208 to a single input audio block 404 to generate block 506 of output audio signal 104. Impulse response blocks 208, input audio block 404, and output audio block 506 are all encoded in the frequency domain. This allows convolution—a mathematical operation that yields the result of applying an impulse response block to an input audio block—to be performed with multiplication, avoiding more time-consuming operations that would be required to apply a convolution in the time domain.

As indicated in operation 502, for each impulse response block 208, an audio processor multiplies the amplitude of each sample with the amplitude of the sample of the corresponding frequency of input audio block 404. As indicated in operation 504, the resulting products are summed on a per-frequency basis and stored as the frequency amplitudes of block 506. One example implementation of this algorithm is indicated below, in pseudo-code:

```
blockSize = 512; // or 1024, or some other power of 2
impulseResponseBlockCount = 200; // e.g. from 20 to 1000
for (b=0; b < impulseResponseBlockCount; b++)
{
   LoadToHardware(impulseResponse[b], blockSize * 2 *
sizeof(float));
}
for (b=0; b < impulseResponseBlockCount; b++)
{
   for ( index = 0; index < blockSize; index++)
   {
      Output[index].real +=
impulseResponse[b][index].real * input[index].real;
      Output[index].imaginary +=
impulseResponse[b][index].imaginary *
input[index].imaginary;
   }
}
```

As indicated, this algorithm defines a "blockSize", which is the number of samples per block—i.e. the number of frequency intervals used to encode the sound data for the period of time represented by a block. The algorithm also defines an "impulseResponseBlockCount", e.g. 200, which indicates how many blocks an impulse response has. Impulse responses with more blocks last for longer periods of time. For example, a long echo effect may be represented by an impulse response that has 1000 blocks, which could represent 10 seconds of echo. The block sizes and block counts indicated above are selected for illustrative purposes, and are not limiting. Other values are similarly contemplated.

The first loop of the algorithm invokes "LoadToHardware" for each impulse response block 208, which copies the pre-computed blocks from main memory to a local memory usable by the audio processor. Since this load operation may be performed once per block 404 of input audio signal 104—e.g. 88 times per second—long load times may negatively impact latency and throughput of audio processing.

The second loop then iteratively performs a convolution operation for each impulse response block 208. For each impulse response block 208, a nested loop multiplies the amplitude of each sample by the amplitude of the sample of the corresponding frequency in the input audio block. The results of these multiplications are accumulated on a per-frequency basis and stored as the amplitudes of the samples of output block 506. Output block 506, which exists in the frequency domain 212, may then be converted to the time domain before being transmitted to an amplifier and speakers to generate the desired sound.

Figure 6A:
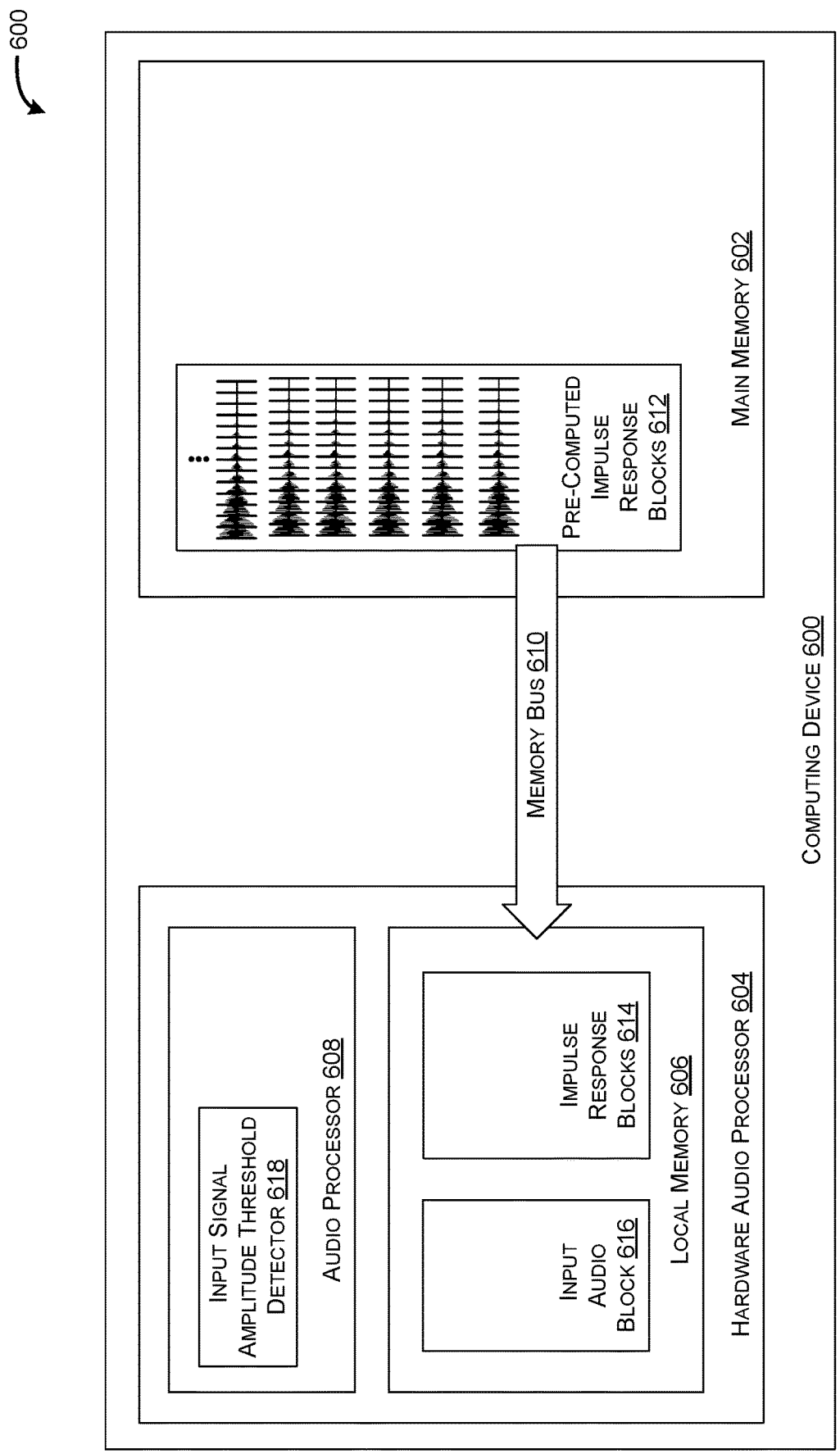
FIG. 6A is a block diagram illustrating a computing device with a hardware audio processor.

FIG. 6A is a block diagram illustrating a computing device 600 with a hardware audio processor 604. Computing device 600 also includes main memory 602, which may be used by a central processing unit and any other domain specific processors. Hardware audio processor 604 includes local memory 606, which is utilized by audio processor 608 when applying effects to or otherwise modifying a live audio signal.

As mentioned above, local memory 606 of hardware audio processor 604 may not be large enough to store all of the sets of impulse response blocks 208 needed by the currently running application. In some configurations, impulse response blocks 614 is a region of local memory 606 where impulse response blocks 208 are stored while they are used by audio processor 608 to generate an effect. The impulse response blocks region 614 may only be large enough to store one or two sets of impulse response blocks 208. In these instances, every input audio block 404 loaded into an input audio block region 616 may have a corresponding set of impulse response blocks 208 retrieved from main memory 602 over memory bus 610.

Figure 6B:
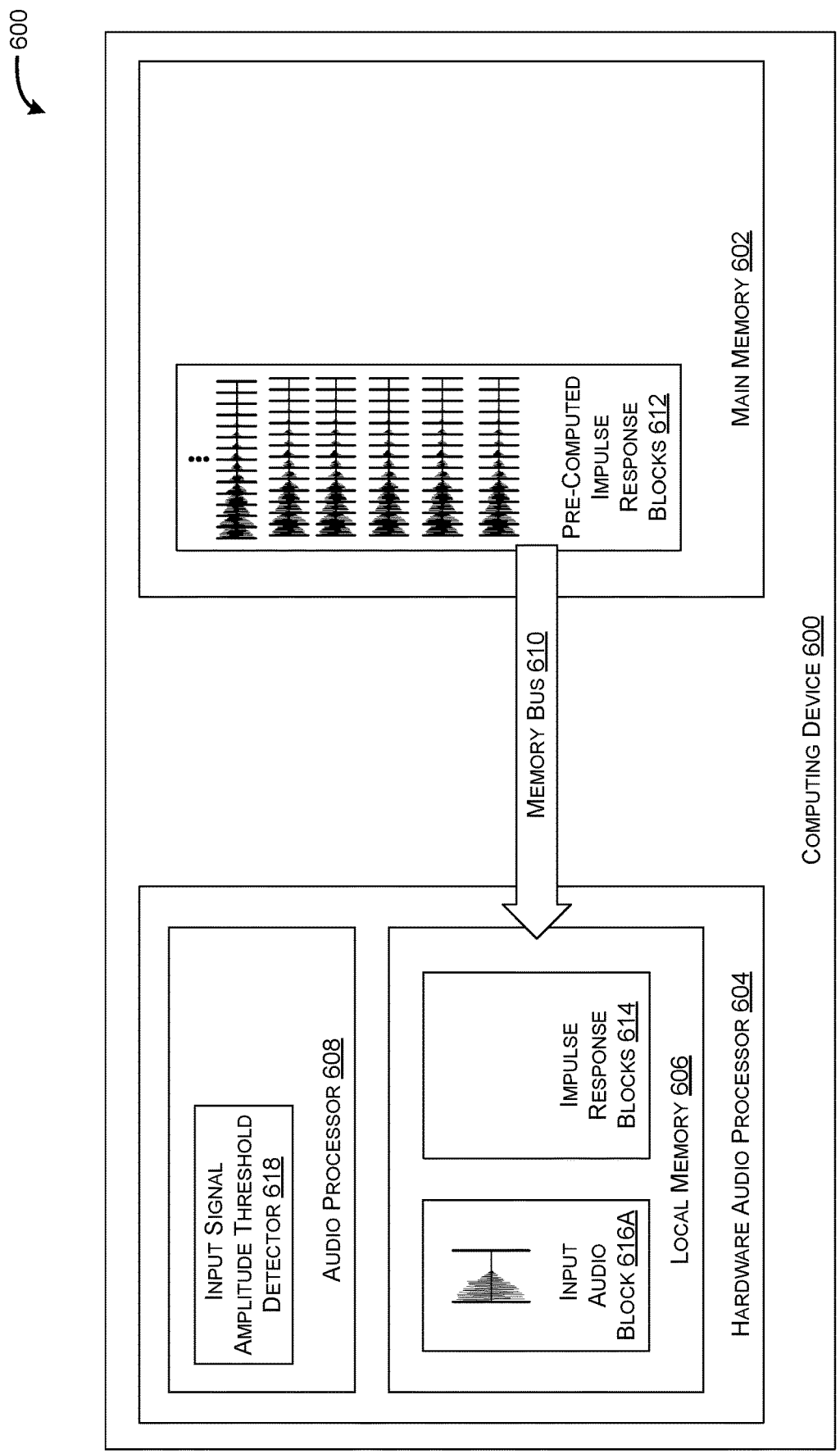
FIG. 6B is a block diagram illustrating the computing device of FIG. 6A having loaded an input audio block into local memory.

FIG. 6B is a block diagram illustrating the computing device 600 of FIG. 6A having loaded an input audio block 404 into the input audio block region 616A of local memory 606.

Figure 6C:
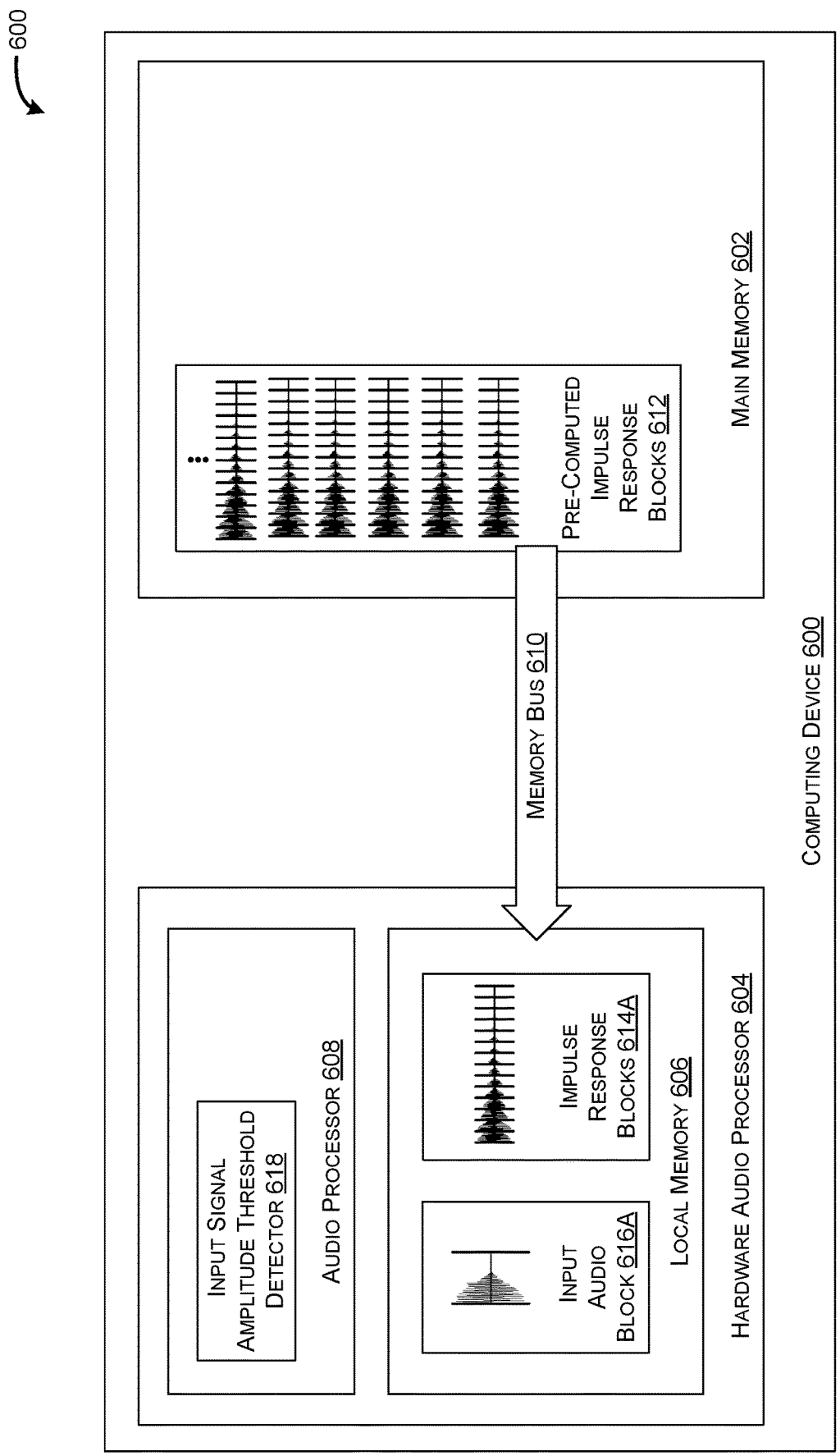
FIG. 6C is a block diagram illustrating the computing device of FIG. 6A having loaded impulse response blocks from main memory into local memory.

FIG. 6C is a block diagram illustrating the computing device 600 of FIG. 6A having loaded impulse response blocks 208 from main memory 602 into region 614A of local memory 606. In some configurations, the set of impulse response blocks 208 loaded into impulse response blocks region 614A may represent one of pre-computed impulse response blocks stored in region 612 of main memory 602. Hardware audio processor 604 may load specific sets of pre-computed impulse response blocks 208 based on an in-game context, such as the terrain an avatar is traveling through.

Figure 6D:
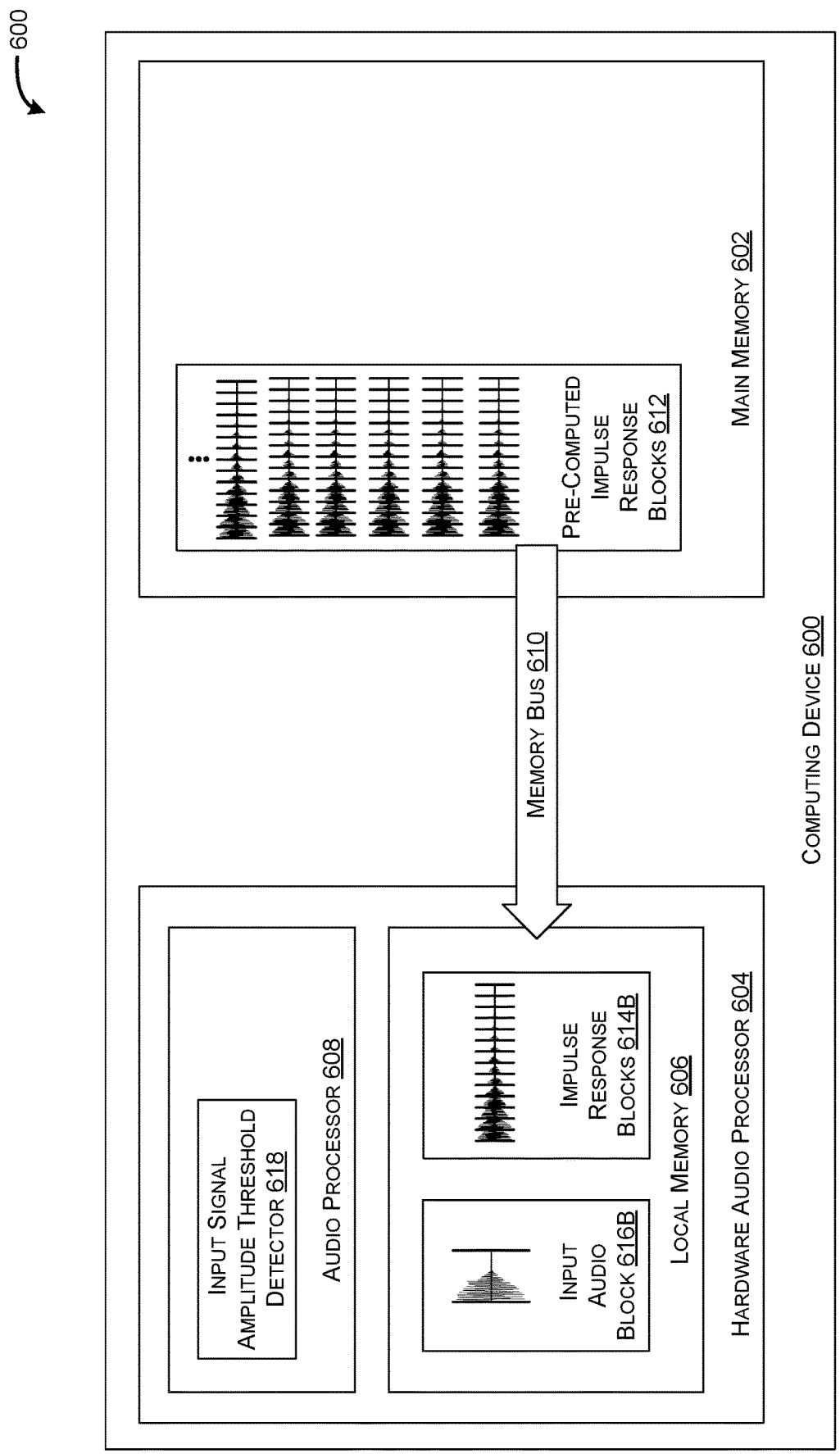
FIG. 6D is a block diagram illustrating the computing device of FIG. 6A having loaded another input audio block and having loaded another set of impulse response blocks from main memory.

FIG. 6D is a block diagram illustrating the computing device 600 of FIG. 6A having loaded another input audio block 404 into input audio block region 616B and having loaded another set of impulse response blocks 208 into impulse response blocks region 614B. This illustrates the iterative nature of loading impulse response blocks across memory bus 610.

Figure 7:
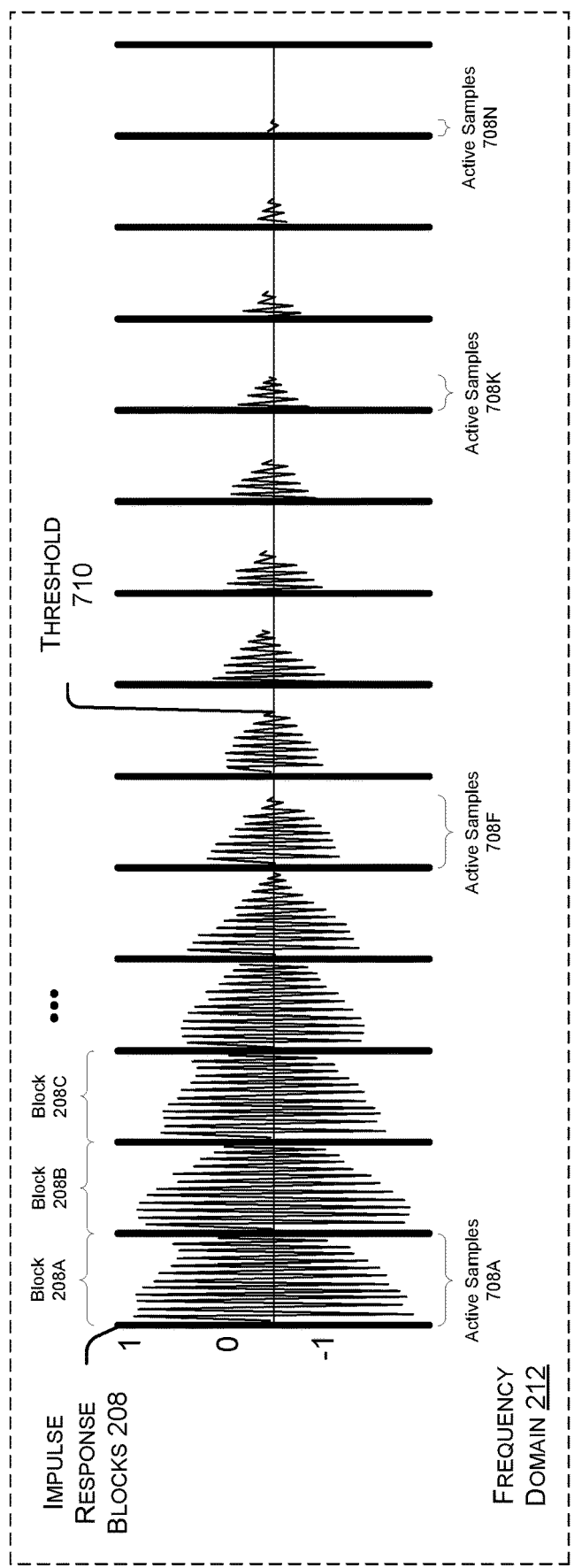
FIG. 7 illustrates a pattern of frequency amplitudes observed in many sets of impulse response blocks.

FIG. 7 illustrates a pattern of amplitudes observed in many sets of impulse response blocks 208. One pattern that has been observed for a wide array of sounds is that most of the energy of the block—i.e. most of the samples with high amplitudes—are found in the lowest frequencies—i.e. the frequencies represented by samples on the left side of a block. Often, amplitudes will diminish as frequency increases—i.e. amplitudes diminish while moving to the right. Also, when moving to the right, a sample with an amplitude of zero or near-zero may be reached. The index of this sample may be a threshold 710, such that samples to the right of the threshold 710 also have amplitudes of zero or near-zero. When this threshold index is less than the block size there is an opportunity to improve efficiency by not transmitting and by not processing the samples beyond this threshold 710.

For example, if block 208K contains 512 frequencies, then a threshold at frequency index 200 would leave 312 frequencies beyond the threshold—312 frequencies with an amplitude of zero or near zero, which do not contribute meaningfully to the output audio signal. The samples of a block that do contribute meaningfully to the output audio signal may be referred to as "active samples". For example, block 208K has active samples 708K.

If a block does not have any samples with amplitudes of zero or near-zero, then the entire block will be usable. For example, block 208A has usable samples 708A that spans the entire block.

Another observed pattern is that for each successive block 208, the threshold index is found further to the left of the block than the previous block—i.e. the index has a smaller value than the block on the left. This is due to the fact that higher frequency sounds tend to die out sooner, and so over time the amplitudes of samples representing higher frequencies will tend towards zero sooner than samples of lower frequencies.

In some configurations, the threshold is identified by an input signal amplitude threshold detector 618, which is a hardware component that scans the samples of an input audio block starting from the last sample 304 (the sample with the highest frequency) towards the first sample 302—i.e. right to left. This detection may be performed in real-time, after a block of the input audio signal 102 has been generated and transformed into the frequency domain for processing. Input signal amplitude threshold detector 618 may identify a threshold index as the index at which the amplitude is not zero or near-zero. Based on the pattern, the amplitudes of samples further to the left of the threshold are likely to also not be zero or near-zero.

For example, a user-defined threshold may determine the amplitude at which a sample is considered to not be zero or near-zero. By adjusting this amount, an end-user may improve sound quality at the expense of processing time and memory bandwidth by reducing the number of samples considered to be zero or near-zero. In the extreme, the user may request lossless audio quality by requiring that only samples with amplitudes of zero are excluded—i.e. the threshold is identified as the first sample with an amplitude that is not zero. Similarly, an end-user may improve processing efficiency at the expense of audio quality by increasing the amplitude a sample must have before it is identified as the threshold.

Figure 8:
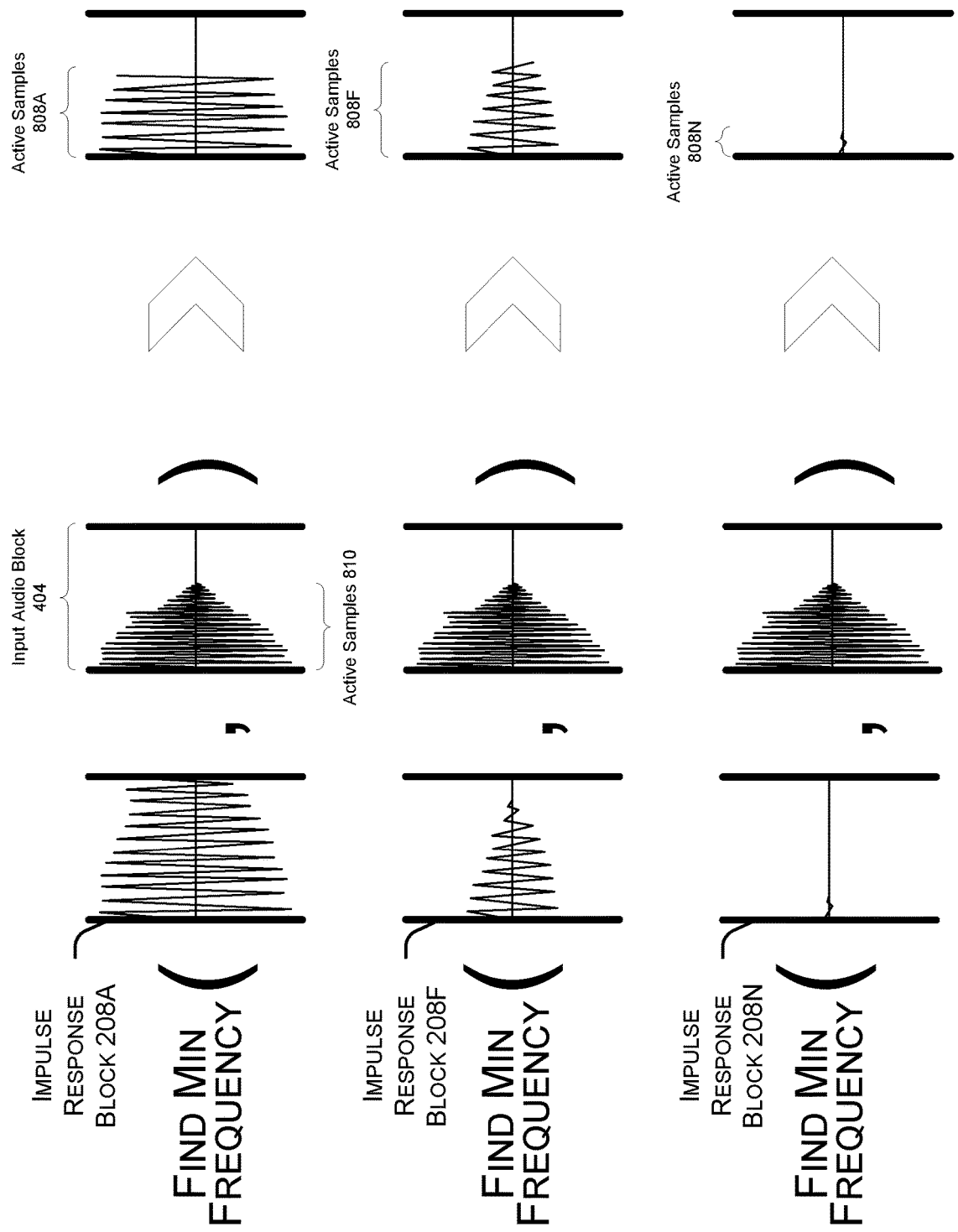
FIG. 8 illustrates identifying a frequency below which an impulse response block and an input audio block both contain active samples.

Two optimizations have been discussed: reducing the number of impulse response block samples transferred from main memory 602 by excluding samples beyond a threshold index, and only performing convolution operations on impulse response block samples that are not excluded by the threshold. FIG. 8 illustrates a third optimization: identifying a frequency below which an impulse response block and an input audio block both contain active samples, and excluding convolution operations on any frequencies higher than the threshold. This optimization applies the same observation to the input audio block 404 itself: any sample with an amplitude of zero or near-zero does not contribute meaningfully to the output audio signal, and may be skipped.

As illustrated, FIG. 8 depicts three impulse response blocks (208A, F, and N) being compared to the same input audio block 404. The input audio block 404 has a threshold frequency 810 above which frequency samples are small enough in amplitude to not contribute meaningfully to the output audio signal. Threshold frequency 810 may be computed in real-time by a hardware audio device from a real-time audio signal generated by an application.

The "Find Min Frequency function finds the minimum index at which both the impulse response block 208 and the input audio block 404 have active samples—i.e. the maximum frequency at which both the impulse response block 208 and the input audio block 404 have samples that are large enough to contribute meaningfully to the output audio signal. Active samples 808A, 808F, and 808N illustrate the amplitudes of impulse response blocks 208A, 208F, and 208N, after removing samples beyond the identified frequency. Impulse response block 208A has active samples throughout, but input audio block 404 only has active samples across the lowest three-fifths of frequencies. Accordingly, Active samples 808A contains the lowest three-fifths of its samples, excluding any samples of frequencies that would be multiplied with a value from input audio block 404 of zero or near-zero. Similarly, active samples 808F of impulse response block 208F illustrates the portion of frequencies of impulse response block 208F that will be used to modify input audio block 404.

In the case of impulse response block 208N, the limiting factor is no longer input audio block 404, but impulse response block 208N itself. Input response block 208N only has usable data over the first eighth of frequencies. As such, active samples 808N extends across the entirety of impulse response block 208N.

Figure 9:
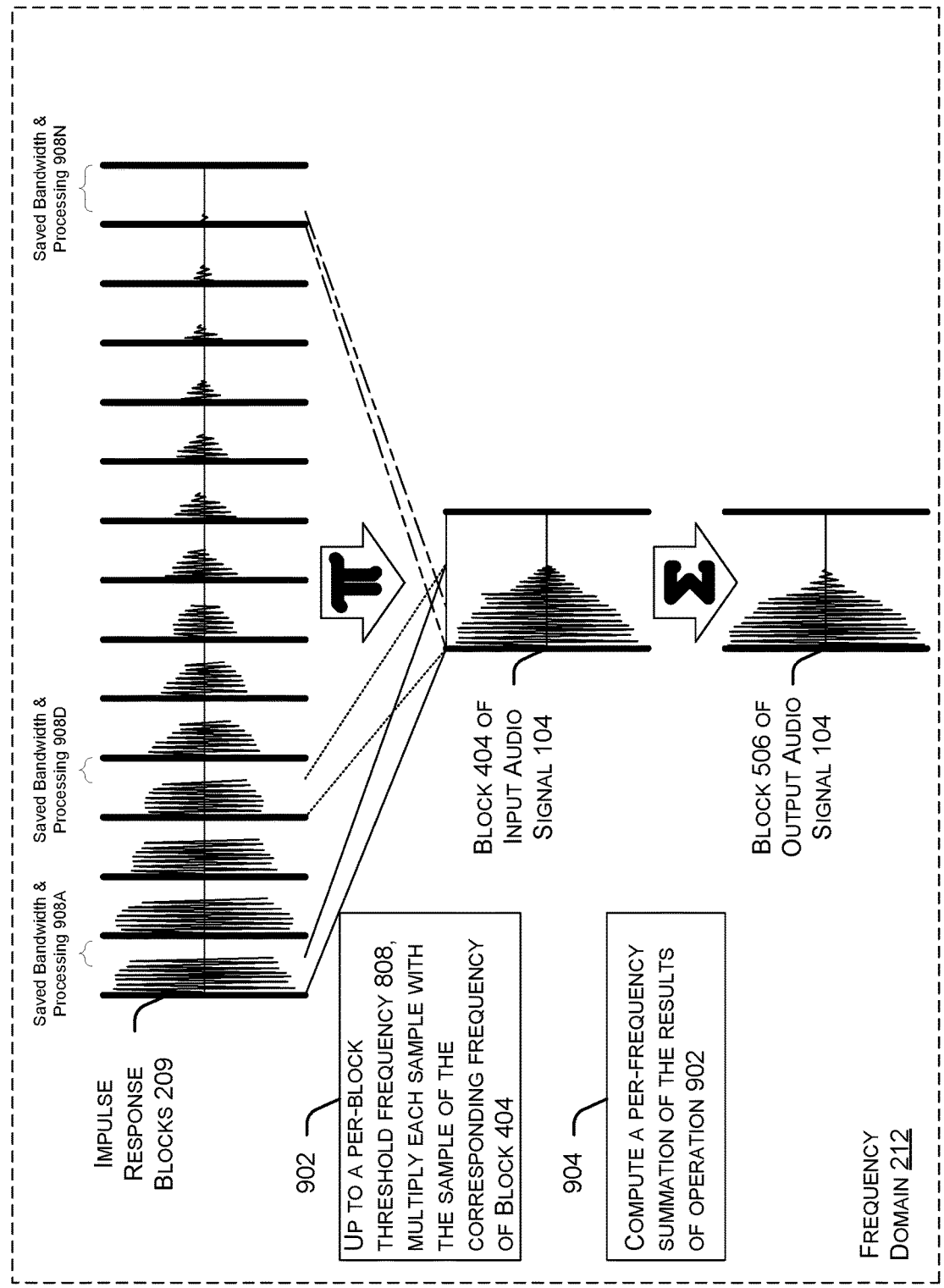
FIG. 9 illustrates computing an output audio block by multiplying the values of select frequencies of an input audio block with the values of corresponding frequencies from each impulse response block.

FIG. 9 illustrates computing an output audio block 506 by multiplying the amplitudes of select frequencies of an input audio block 404 with the amplitudes of corresponding frequencies from each impulse response block 208. As indicated in operation 902, only the frequencies up to the threshold frequency index are multiplied to the corresponding frequencies of block 404. For every frequency that is skipped, two floating point multiplication operations are saved—one for the real part and one for the imaginary part. As indicated in operation 904, a per-frequency summation of the results of operation 902 are computed. The computational resources of modifying the input audio signal are further reduced by only adding the results of multiplications that yielded usable results. As such, any multiplications that are skipped also save a floating point addition.

One example implementation is indicated below, in pseudo-code:

```
blockSize = 512; // or 1024, or some other power of 2
impulseResponseBlockCount = 200; // e.g. from 20 to 1000
LoadImpulseResponseReductionTable(reductionTable)
for (b=0; b < impulseResponseBlockCount; b++)
{
    LoadToHardware(impulseResponse[b],
reductionTable[b] * 2 * sizeof(float));
}
for (b=0; b < impulseResponseBlockCount; b++)
{
    reducedBlockSize = min(reductionTable[b],
activeInputBlockSize);
    for (index = 0; index < reducedBlockSize; index++)
```

```
    {
        Output[index].real +=
impulseResponse[b][index].real * input[index].real;
        Output[index].imaginary +=
impulseResponse[b][index].imaginary *
input[index].imaginary;
    }
}
```

This code is similar to the code described above in conjunction with FIG. 5, but updated to illustrate some of the optimizations disclosed herein. "LoadImpulseResponseReductionTable(reductionTable)" loads "reductionTable"—a table of threshold indices, one index for each block 208 of the impulse response. These values may be pre-computed. Then, for each block, the "LoadToHardware(impulseResponse[b], reductionTable[b]*2*sizeof(float));" statement uses the per-block threshold index to limit the number of samples loaded for each block. Specifically, instead of always loading "blockSize" samples—e.g. 512 samples—as was done in the pseudo-code discussed above in conjunction with FIG. 5, "reductionTable[b]" samples are loaded—i.e. the number located a the b'th index of "reductionTable". The samples beyond the index stored in "reductionTable[b]" are assumed to have amplitudes of zero or near-zero for each block "b".

The "reducedBlockSize=min(reductionTable[b], activeInputBlockSize);" statement illustrates further limiting which samples to include in the convolution by also excluding frequencies that have zero or near-zero amplitudes in the input audio signal block 404. activeInputBlockSize may be computed by input signal amplitude threshold detector 618 in real-time based on the current input block.

Figure 10:
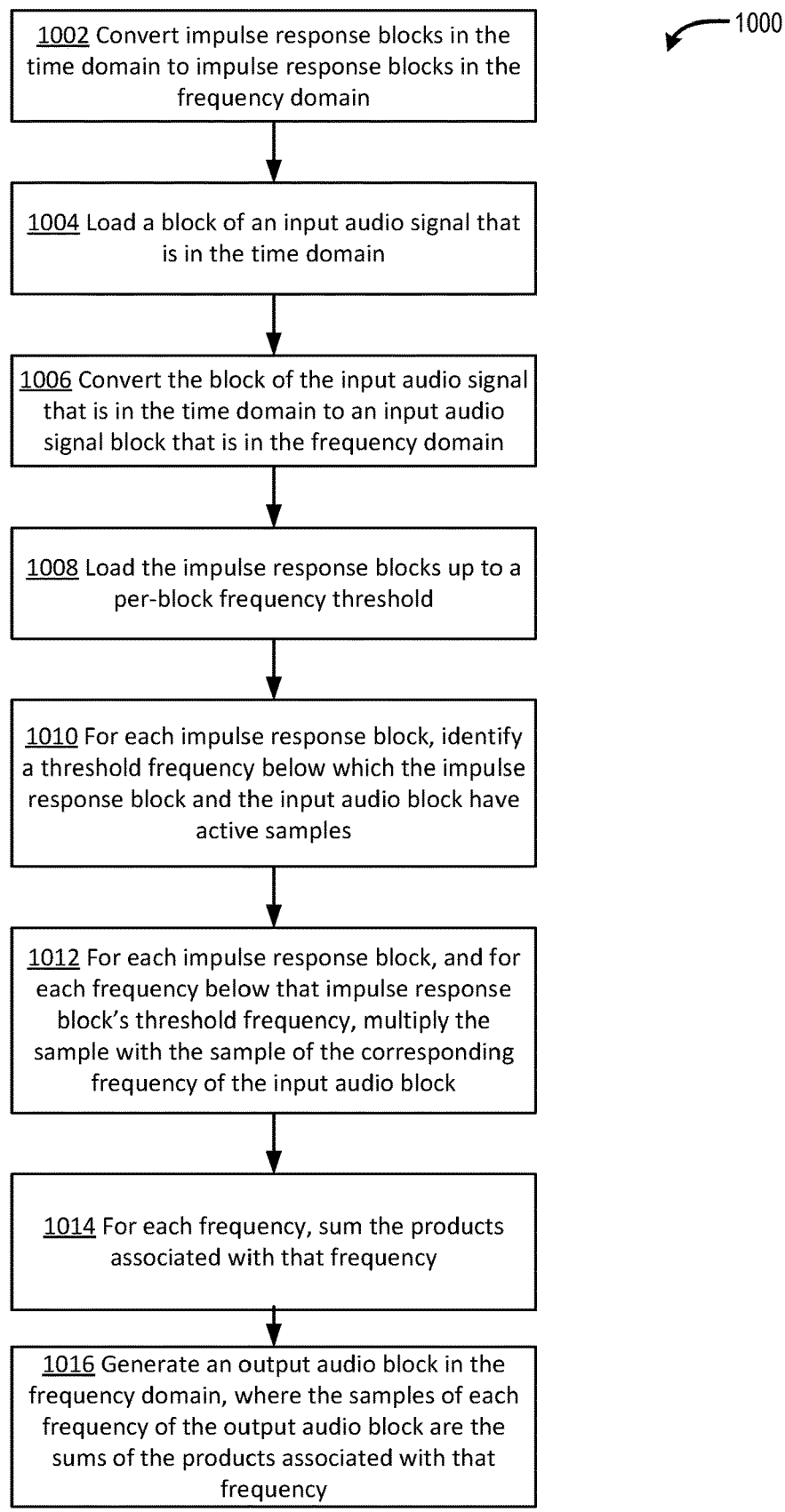
FIG. 10 is a flow diagram illustrating an example operational procedure according to the described implementations.

FIG. 10 is a flow diagram illustrating an example operational procedure 1000 according to the described implementations. Procedure 1000 begins with operation 1002, where Fourier Transform 206 converts impulse response blocks 202 in a time domain 204 to impulse response blocks 208 in the frequency domain 212.

Procedure 1000 continues at operation 1004, where hardware audio processor 604 loads a block of an input audio signal 102 into local memory 606.

Procedure 1000 continues at operation 1006, where hardware audio processor 604 converts the block 402 of the input audio signal 102 that is in the time domain 204 to an input audio signal block 404 that is in the frequency domain 212.

Procedure 1000 continues at operation 1008, where hardware audio processor 604 load the impulse response blocks 208 up to a per-block frequency threshold 710.

Procedure 1000 continues at operation 1010, where for each impulse response block 208, a threshold frequency below which the impulse response block and the input audio block have active samples is identified. This process is discussed above in conjunction with FIG. 8.

Procedure 1000 continues at operation 1012, where for each impulse response block 208, and for each frequency below that impulse response block's threshold frequency 710, the hardware audio processor 604 multiplies the values of the sample by the values of the corresponding sample from the input audio block 404.

Procedure 1000 continues at operation 1014, where, for each frequency, hardware audio processor 604 sums the products associated with that frequency.

Procedure 1000 continues to operation 1016, where hardware audio processor 604 generates an output audio block 506 in the frequency domain 212. The amplitudes of the samples of the output audio block 506 are based on the sums of the products associated with the corresponding frequency that were computed in operation 1014.

It should be understood that the illustrated methods can end at any time and need not be performed in their entireties. Some or all operations of the methods, and/or substantially equivalent operations, can be performed by execution of computer-readable instructions included on a computer-storage media, as defined below. The term "computer-readable instructions," and variants thereof, as used in the description and claims, is used expansively herein to include routines, applications, application modules, program modules, programs, components, data structures, algorithms, and the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These operations, structural devices, acts, and modules may be implemented in software, in firmware, in special purpose digital logic, and any combination thereof.

For example, the operations of the described methods are described herein as being implemented, at least in part, by system components, which can comprise an application, component and/or a circuit. In some embodiments, the system components include a dynamically linked library (DLL), a statically linked library, functionality produced by an application programing interface (API), a compiled program, an interpreted program, a script or any other executable set of instructions. Data can be stored in a data structure in one or more memory components. Data can be retrieved from the data structure by addressing links or references to the data structure.

Although FIG. 10 refers to the components of FIGS. 1-9, it can be appreciated that the operations of the described methods may be also implemented in many other ways. For example, the methods may be implemented, at least in part, by a processor of another remote computer or a local circuit. In addition, one or more of the operations of the methods may alternatively or additionally be implemented, at least in part, by a chipset working alone or in conjunction with other software modules. Any service, circuit or application suitable for providing the techniques disclosed herein can be used in operations described herein.

Figure 11:
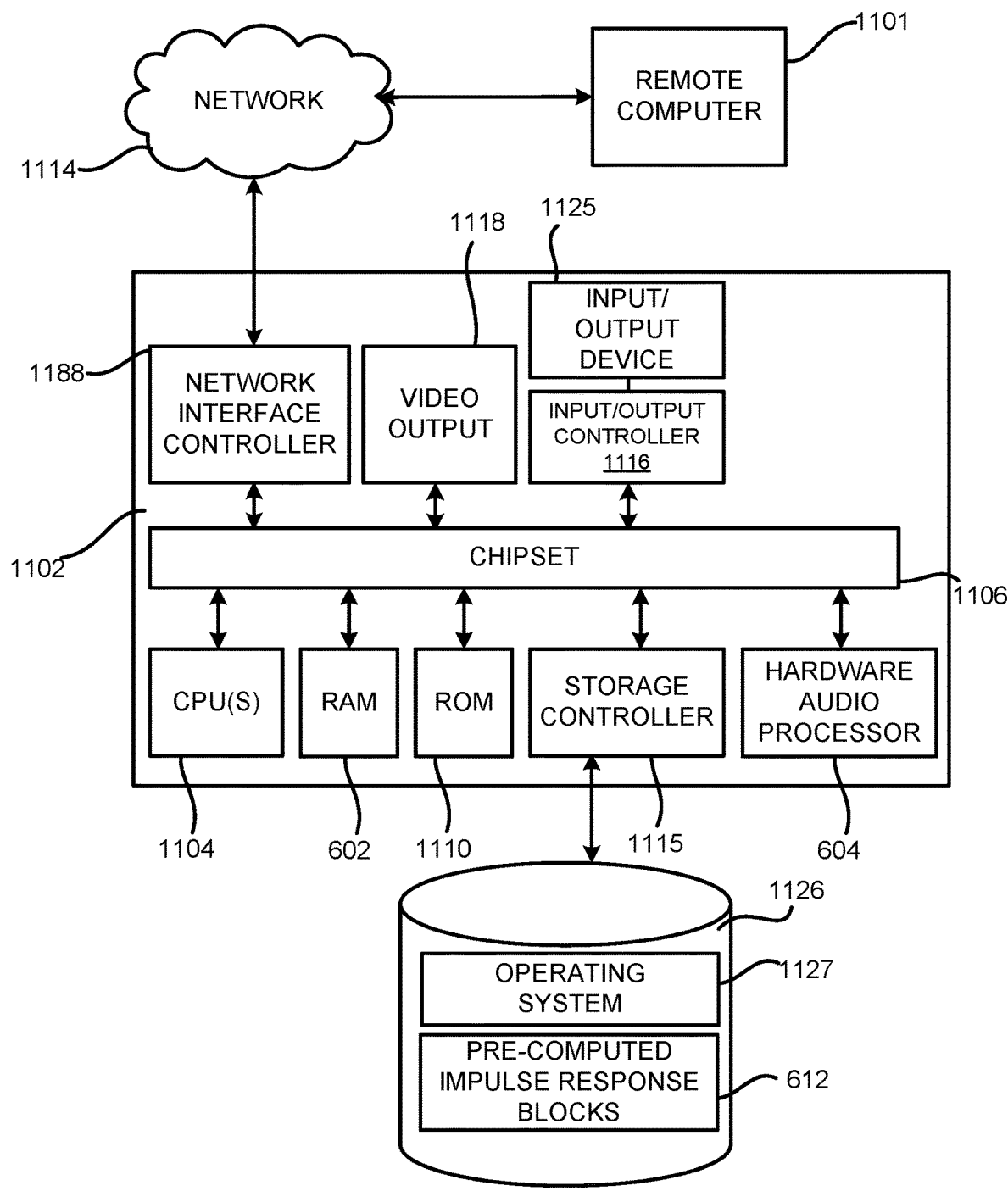
FIG. 11 is a computer architecture diagram illustrating a computing device architecture for a computing device capable of implementing aspects of the techniques and technologies presented herein.

FIG. 11 is a computer architecture diagram illustrating a computing device architecture for a computing device capable of implementing aspects of the techniques and technologies presented herein. The computer architecture shown in FIG. 11 illustrates aspects of a system, such as a conventional server computer, workstation, desktop computer, laptop, tablet, video game system, computers or processing systems embedded in devices (such as wearables, automobiles, home automation etc.), or other computing device, and may be utilized to execute any of the software components presented herein. For example, the computer architecture shown in FIG. 11 may be utilized to execute any of the software components described above.

The computer architecture includes a baseboard 1102, or "motherboard," which is a printed circuit board to which a multitude of components or devices may be connected by way of a system bus or other electrical communication paths. In one illustrative embodiment, one or more central processing units (CPUs) 1104 operate in conjunction with a chipset 1106. The CPUs 1104 may be standard programmable processors that perform arithmetic and logical operations necessary for the operation of the computer architecture.

The CPUs 1104 perform operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, and the like.

The chipset 1106 provides an interface between the CPUs 1104 and the remainder of the components and devices on the baseboard 1102. The chipset 1106 may provide an interface to a RAM 602, used as the main memory in the computer architecture. The chipset 1106 may further provide an interface to a computer-readable storage medium such as a read-only memory (ROM) 1110 or non-volatile RAM (NVRAM) for storing basic routines that help to startup the computing device and to transfer information between the various components and devices. The ROM 1110 or NVRAM may also store other software components necessary for the operation of the computer architecture in accordance with the embodiments described herein.

The computer architecture may operate in a networked environment using logical connections to remote computing devices and computer systems through a network 1114, such as the local area network. The chipset 1106 may include functionality for providing network connectivity through a network interface controller (NIC) 1188, such as a gigabit Ethernet adapter. The NIC 1188 is capable of connecting the computer architecture to other computing devices over the network 1114. It should be appreciated that multiple NICs 1188 may be present in the computer architecture, connecting the computer to other types of networks and remote computer systems. The network allows the computer architecture to communicate with remote services and servers, such as the remote computer 1101. As can be appreciated, the remote computer 1101 may be any computing device.

The computer architecture may be connected to a mass storage device 1126 that provides non-volatile storage for the computing device. The mass storage device 1126 may store system programs, application programs, other program modules, and data, which have been described in greater detail herein. The mass storage device 1126 may be connected to the computer architecture through a storage controller 1115 connected to the chipset 1106. The mass storage device 1126 may consist of one or more physical storage units. The storage controller 1115 may interface with the physical storage units through a serial attached SCSI (SAS) interface, a serial advanced technology attachment (SATA) interface, a fiber channel (FC) interface, or other type of interface for physically connecting and transferring data between computers and physical storage units. It should also be appreciated that the mass storage device 1126, other storage media and the storage controller 1115 may include MultiMediaCard (MMC) components, eMMC components, Secure Digital (SD) components, PCI Express components, or the like.

The computer architecture may store data on the mass storage device 1126 by transforming the physical state of the physical storage units to reflect the information being stored. The specific transformation of physical state may depend on various factors, in different implementations of this description. Examples of such factors may include, but are not limited to, the technology used to implement the physical storage units, whether the mass storage device 1126 is characterized as primary or secondary storage, and the like.

For example, the computer architecture may store information to the mass storage device 1126 by issuing instructions through the storage controller 1115 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer architecture may further read information from the mass storage device 1126 by detecting the physical states or characteristics of one or more particular locations within the physical storage units.

In addition to the mass storage device 1126 described above, the computer architecture may have access to other computer-readable media to store and retrieve information, such as program modules, data structures, or other data. As the operating system 1127, pre-computed impulse response blocks, and other modules are depicted as data and software stored in the mass storage device 1126, it should be appreciated that these components and/or other modules may be stored, at least in part, in other computer-readable storage media of the computer architecture. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid state memory technology, CD-ROM, digital versatile disks (DVD), HD-DVD, BLU-RAY, or other optical storage, magnetic cassettes, magnetic tape, magnetic disk storage or other magnetic storage devices, or any other medium that can be used to store the desired information and which can be accessed by the computer architecture. For purposes of the claims, the phrase "computer storage medium," "computer-readable storage medium," and variations thereof, does not include waves or signals per se and/or communication media.

The mass storage device 1126 may store an operating system 1127 utilized to control the operation of the computer architecture. According to one embodiment, the operating system comprises a gaming operating system. According to another embodiment, the operating system comprises the WINDOWS® operating system from MICROSOFT Corporation. According to further embodiments, the operating system may comprise the UNIX, ANDROID, or iOS operating systems, available from their respective manufacturers. It should be appreciated that other operating systems may also be utilized. The mass storage device 1126 may store other system or application programs and data utilized by the computer architecture, such as any of the other software components and data described above. The mass storage device 1126 might also store other programs and data not specifically identified herein.

In one embodiment, the mass storage device 1126 or other computer-readable storage media is encoded with computer-executable instructions which, when loaded into the computer architecture, transform the computer from a general-purpose computing system into a special-purpose computer capable of implementing the embodiments described herein. These computer-executable instructions transform the computer architecture by specifying how the CPUs 1104 transition between states, as described above. According to one embodiment, the computer architecture has access to computer-readable storage media storing computer-executable instructions which, when executed by the computer architecture, perform the various routines described above with regard to FIG. 10, and the other FIGS. The computing device might also include computer-readable storage media for performing any of the other computer-implemented operations described herein.

The computer architecture may also include one or more input/output controllers 1116 for receiving and processing input from a number of input devices, such as a keyboard, a mouse, a microphone, a headset, a touchpad, a touch screen, an electronic stylus, image processing and gesture recognition devices, or any other type of input device. The input/output controller 1116 is in communication with an input/output device 1125. The input/output controller 1116 may provide output to a display, such as a computer monitor, a flat-panel display, a digital projector, a printer, a plotter, or other type of output device. The input/output controller 1116 may provide input communication with other devices such as a microphone, a speaker, game controllers and/or audio devices.

The computer architecture may also include one or more video outputs 1118, e.g. video card adapters capable of generating graphics and other media on a monitor or other display adapter.

The computer architecture may also include co-processors, field programmable gate arrays, application-specific integrated circuits, or other special-purpose hardware, such as hardware audio processor 604. Hardware audio processor may include a local memory that is in communication with main memory 602.

Each of the processes, methods and algorithms described in the preceding sections may be embodied in, and fully or partially automated by, code modules executed by one or more computers or computer processors. The code modules may be stored on any type of non-transitory computer-readable medium or computer storage device, such as hard drives, solid state memory, optical disc and/or the like. The processes and algorithms may be implemented partially or wholly in application specific circuitry. The results of the disclosed processes and process steps may be stored, persistently or otherwise, in any type of non-transitory computer storage such as, e.g., volatile or non-volatile storage.

The various features and processes described above may be used independently of one another or may be combined in various ways. All possible combinations and sub combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel or in some other manner. Blocks or states may be added to or removed from the disclosed example embodiments. The example systems and components described herein may be configured differently than described. For example, elements may be added to, removed from or rearranged compared to the disclosed example embodiments.

It will also be appreciated that various items are illustrated as being stored in memory or on storage while being used, and that these items or portions of thereof may be transferred between memory and other storage devices for purposes of memory management and data integrity. Alternatively, in other embodiments some or all of the software modules and/or systems may execute in memory on another device and communicate with the illustrated computing systems via inter-computer communication. Furthermore, in some embodiments, some or all of the systems and/or modules may be implemented or provided in other ways, such as at least partially in firmware and/or hardware, including, but not limited to, one or more application specific integrated circuits (ASICs), standard integrated circuits, controllers (e.g., by executing appropriate instructions, and including microcontrollers and/or embedded controllers), field-programmable gate arrays (FPGAs), complex programmable logic devices (CPLDs), etc. Accordingly, the present invention may be practiced with other computer system configurations.

Conditional language used herein, such as, among others, "can," "could," "might," "may," "e.g." and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having" and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some or all of the elements in the list.

The disclosure presented herein may be considered in view of the following clauses.

Clause 1: A computer-implemented method for efficient real-time audio processing, the method comprising: receiving an audio signal block (404) comprising a first plurality of frequency samples (408) ordered from a lowest frequency (410) to a highest frequency (412); identifying an impulse response block (208) to convolve with the audio signal block (404) to generate an output audio signal (106), wherein the impulse response block (208) comprises a second plurality of frequency samples (308) ordered from the lowest frequency (410) to the highest frequency (412); identifying a first threshold frequency (810) above which frequency samples of the first plurality of frequency samples (408) would contribute less than a threshold amount of volume to the output audio signal (106); identifying a second threshold frequency (710) above which frequency samples of the second plurality of frequency samples (308) would contribute less than the threshold amount of volume to the output audio signal (106); copying, to an audio processing device (608), frequency samples of the second plurality of frequency samples (308) that are less than the second threshold frequency (710); identifying as a maximum frequency (808) a minimum of the first threshold frequency (810) and the second threshold frequency (710); performing a convolution (902), from the lowest frequency (410) to the maximum threshold frequency (808), on frequency samples from the first plurality of frequency samples (408) with frequency samples from the second plurality of frequency samples (308); and generating the output audio signal (106) based on a result of the convolution (902).

Clause 2: The computer-implemented method of clause 1, wherein a frequency sample contributes less than the threshold amount of volume to the output audio signal when the frequency sample has an amplitude that is zero or within a defined threshold of zero.

Clause 3: The computer-implemented method of clause 1, wherein the impulse response block is one of a plurality of impulse response blocks, wherein the second threshold frequency is identified for each of the plurality of impulse response blocks, wherein the maximum threshold frequency is identified for each of the plurality of impulse response blocks, and wherein the convolution operation is performed on the audio signal block for each of the plurality of impulse response blocks.

Clause 4: The computer-implemented method of clause 3, wherein the second threshold frequencies identified for each of the plurality of response blocks are pre-computed and stored in a reduction table.

Clause 5: The computer-implemented method of clause 4, wherein the reduction table is copied from a main memory to the audio processing device before frequency samples of the plurality of impulse response blocks are copied to the audio processing device from the main memory.

Clause 6: The computer-implemented method of clause 1, wherein the first threshold frequency is computed in real-time by the audio processing device.

Clause 7: The computer-implemented method of clause 1, wherein the audio signal block and the impulse response block are encoded in a frequency domain in which frequency samples identify amounts of sound recorded within a range of frequencies.

Clause 8: A computer-readable storage medium (606) having computer-executable instructions stored thereupon which, when executed by an audio processing device (608), cause the audio processing device (608) to: receive an audio signal block (404) comprising a first plurality of frequency samples (408) ordered from a lowest frequency (410) to a highest frequency (412); identify an impulse response block (208) to convolve with the audio signal block (404) to generate an output audio signal (106), wherein the impulse response block (208) comprises a second plurality of frequency samples (308) ordered from the lowest frequency (410) to the highest frequency (412); identify a threshold frequency (710) above which frequency samples of the second plurality of frequency samples (308) would contribute less than a threshold amount of volume to the output audio signal (106); receive frequency samples of the second plurality of frequency samples (308) that are less than the threshold frequency (710); perform a convolution (902), from the lowest frequency (410) to the threshold frequency (710), on frequency samples from the first plurality of frequency samples (408) with frequency samples from the second plurality of frequency samples (308); and generate the output audio signal (106) based on a result of the convolution (902).

Clause 9: The computer-readable storage medium of clause 8, wherein an individual frequency sample is determined to contribute less than the threshold amount of volume by estimating a contribution to the output audio signal from performing a convolution operation on the individual frequency sample and a corresponding frequency sample of the first plurality of frequency samples.

Clause 10: The computer-readable storage medium of clause 9, wherein the individual frequency sample contributes less than the threshold amount of volume to the output audio signal when the frequency sample has an amplitude that is zero or within a defined threshold of zero.

Clause 11: The computer-readable storage medium of clause 8, wherein the computer-executable instructions further cause the audio processing device to: receive an input audio signal generated by an application, wherein the input audio signal is encoded in a time domain; and converting at least a portion of the input audio signal to the audio signal block by applying a Fourier transform.

Clause 12: The computer-readable storage medium of clause 8, wherein the impulse response block is one of a plurality of impulse response blocks, wherein the second threshold frequency is identified for each of the plurality of impulse response blocks, wherein the maximum threshold frequency is identified for each of the plurality of impulse response blocks, and wherein the convolution operation is performed on the audio signal block for each of the plurality of impulse response blocks.

Clause 13: The computer-readable storage medium of clause 12, wherein the convolution is performed by: for each individual impulse response block of the plurality of impulse response blocks: for each individual frequency below the second threshold frequency of the individual impulse response block: multiply the individual frequency sample from the individual impulse response block with the corresponding frequency sample of the input audio block; and sum the results of the multiplications for each frequency.

Clause 14: The computer-readable storage medium of clause 8, wherein the threshold frequency comprises a second threshold frequency, and wherein the computer-executable instructions further cause the audio processing device to: identify a first threshold frequency above which frequency samples of the first plurality of frequency samples would contribute less than a threshold amount of volume to the output audio signal; identify as a maximum frequency a minimum of the first threshold frequency and the second threshold frequency; and wherein the convolution is performed from the lowest frequency to the maximum threshold frequency.

Clause 15: A computing device (600), comprising: at least one processor (608); and a computer-readable storage medium (606) having computer-executable instructions stored thereupon which, when executed by the at least one processor (608), cause the computing device (600) to: receive an audio signal block (404) in a frequency domain comprising a first plurality of frequency samples (408) ordered from a lowest frequency (410) to a highest frequency (412); identify an impulse response block (208) to convolve with the audio signal block (404) to generate an output audio signal (106), wherein the impulse response block (208) comprises a second plurality of frequency samples (308) ordered from the lowest frequency (410) to the highest frequency (412); identify a threshold frequency (710) above which frequency samples of the second plurality of frequency samples (308) would contribute less than a threshold amount of volume to the output audio signal (106); receive frequency samples of the second plurality of frequency samples (308) that are less than the threshold frequency (710); perform a convolution (902), from the lowest frequency (410) to the threshold frequency (710), on frequency samples from the first plurality of frequency samples (408) with frequency samples from the second plurality of frequency samples (308); and generate the output audio signal (106) based on a result of the convolution (902).

Clause 16: The computing device of clause 15, wherein the threshold frequency comprises a second threshold frequency, and wherein the computer-executable instructions further cause the audio processing device to: identify a first threshold frequency above which frequency samples of the first plurality of frequency samples would contribute less than a threshold amount of volume to the output audio signal; identify as a maximum frequency a minimum of the first threshold frequency and the second threshold frequency; and wherein the convolution is performed from the lowest frequency to the maximum threshold frequency.

Clause 17: The computing device of clause 16, wherein a frequency sample contributes less than the threshold amount of volume to the output audio signal when the frequency sample has an amplitude that is zero or within a defined threshold of zero.

Clause 18: The computing device of clause 15, wherein the impulse response block is one of a plurality of impulse response blocks, wherein the second threshold frequency is identified for each of the plurality of impulse response blocks, wherein the maximum threshold frequency is identified for each of the plurality of impulse response blocks, and wherein the convolution operation is performed on the audio signal block for each of the plurality of impulse response blocks.

Clause 19: The computing device of clause 18, wherein the second threshold frequencies identified for each of the plurality of response blocks are pre-computed and stored in a reduction table.

Clause 20: The computing device of clause 19, wherein the reduction table is copied from a main memory to the audio processing device before frequency samples of the plurality of impulse response blocks are copied to the audio processing device from the main memory.

While certain example embodiments have been described, these embodiments have been presented by way of example only and are not intended to limit the scope of the inventions disclosed herein. Thus, nothing in the foregoing description is intended to imply that any particular feature, characteristic, step, module or block is necessary or indispensable. Indeed, the novel methods and systems described herein may be embodied in a variety of other forms; furthermore, various omissions, substitutions and changes in the form of the methods and systems described herein may be made without departing from the spirit of the inventions disclosed herein. The accompanying claims and their equivalents are intended to cover such forms or modifications as would fall within the scope and spirit of certain of the inventions disclosed herein.

The invention claimed is:

1. A computer-implemented method for efficient real-time audio processing, the method comprising:
    receiving an audio signal block comprising a first plurality of frequency samples ordered from a lowest frequency to a highest frequency;
    identifying an impulse response block to convolve with the audio signal block to generate an output audio signal, wherein the impulse response block comprises a second plurality of frequency samples ordered from the lowest frequency to the highest frequency;
    identifying a first threshold frequency above which frequency samples of the first plurality of frequency samples would contribute less than a threshold amount of volume to the output audio signal;
    identifying a second threshold frequency above which frequency samples of the second plurality of frequency samples would contribute less than the threshold amount of volume to the output audio signal;
    copying, to an audio processing device, frequency samples of the second plurality of frequency samples that are less than the second threshold frequency;
    identifying as a maximum frequency a minimum of the first threshold frequency and the second threshold frequency;
    performing a convolution, from the lowest frequency to the maximum threshold frequency, on frequency samples from the first plurality of frequency samples with frequency samples from the second plurality of frequency samples; and
    generating the output audio signal based on a result of the convolution.

2. The computer-implemented method of claim 1, wherein a frequency sample contributes less than the threshold amount of volume to the output audio signal when the frequency sample has an amplitude that is zero or within a defined threshold of zero.

3. The computer-implemented method of claim 1, wherein the impulse response block is one of a plurality of impulse response blocks, wherein the second threshold frequency is identified for each of the plurality of impulse response blocks, wherein the maximum threshold frequency is identified for each of the plurality of impulse response blocks, and wherein the convolution operation is performed on the audio signal block for each of the plurality of impulse response blocks.

4. The computer-implemented method of claim 3, wherein the second threshold frequencies identified for each of the plurality of response blocks are pre-computed and stored in a reduction table.

5. The computer-implemented method of claim 4, wherein the reduction table is copied from a main memory to the audio processing device before frequency samples of the plurality of impulse response blocks are copied to the audio processing device from the main memory.

6. The computer-implemented method of claim 1, wherein the first threshold frequency is computed in real-time by the audio processing device.

7. The computer-implemented method of claim 1, wherein the audio signal block and the impulse response block are encoded in a frequency domain in which frequency samples identify amounts of sound recorded within a range of frequencies, wherein copying the frequency samples of the second plurality of frequency samples comprises filtering the second plurality of frequency samples based on the second threshold frequency, and wherein the filtering occurs before the convolution is performed.

8. A computer-readable storage medium having computer-executable instructions stored thereupon which, when executed by an audio processing device, cause the audio processing device to:
   receive an audio signal block comprising a first plurality of frequency samples ordered from a lowest frequency to a highest frequency;
   identify an impulse response block to convolve with the audio signal block to generate an output audio signal, wherein the impulse response block comprises a second plurality of frequency samples ordered from the lowest frequency to the highest frequency;
   identify a threshold frequency above which frequency samples of the second plurality of frequency samples would contribute less than a threshold amount of volume to the output audio signal;
   receive frequency samples of the second plurality of frequency samples that are less than the threshold frequency;
   perform a convolution, from the lowest frequency to the threshold frequency, on frequency samples from the first plurality of frequency samples with frequency samples from the second plurality of frequency samples; and
   generate the output audio signal based on a result of the convolution.

9. The computer-readable storage medium of claim 8, wherein an individual frequency sample is determined to contribute less than the threshold amount of volume by estimating a contribution to the output audio signal from performing a convolution operation on the individual frequency sample and a corresponding frequency sample of the first plurality of frequency samples.

10. The computer-readable storage medium of claim 9, wherein the individual frequency sample contributes less than the threshold amount of volume to the output audio signal when the frequency sample has an amplitude that is zero or within a defined threshold of zero.

11. The computer-readable storage medium of claim 8, wherein the computer-executable instructions further cause the audio processing device to:
   receive an input audio signal generated by an application, wherein the input audio signal is encoded in a time domain; and
   converting at least a portion of the input audio signal to the audio signal block by applying a Fourier transform.

12. The computer-readable storage medium of claim 8, wherein the threshold frequency comprises a second threshold frequency, and wherein the computer-executable instructions further cause the audio processing device to:
   identify a first threshold frequency above which frequency samples of the first plurality of frequency samples would contribute less than a threshold amount of volume to the output audio signal;
   identify as a maximum frequency a minimum of the first threshold frequency and the second threshold frequency; and
   wherein the convolution is performed from the lowest frequency to the maximum threshold frequency.

13. The computer-readable storage medium of claim 12, wherein the impulse response block is one of a plurality of impulse response blocks, wherein the second threshold frequency is identified for each of the plurality of impulse response blocks, wherein the maximum frequency is identified for each of the plurality of impulse response blocks, and wherein the convolution operation is performed on the audio signal block for each of the plurality of impulse response blocks.

14. The computer-readable storage medium of claim 13, wherein the convolution is performed by:
   for each individual impulse response block of the plurality of impulse response blocks:
      for each individual frequency below the second threshold frequency of the individual impulse response block:
         multiply the individual frequency sample from the individual impulse response block with the corresponding frequency sample of the input audio block; and
         sum the results of the multiplications for each frequency.

15. A computing device, comprising:
   at least one processor; and
   a computer-readable storage medium having computer-executable instructions stored thereupon which, when executed by the at least one processor, cause the computing device to:
      receive an audio signal block in a frequency domain comprising a first plurality of frequency samples ordered from a lowest frequency to a highest frequency;
      identify an impulse response block to convolve with the audio signal block to generate an output audio signal, wherein the impulse response block comprises a second plurality of frequency samples ordered from the lowest frequency to the highest frequency;
      identify a threshold frequency above which frequency samples of the second plurality of frequency samples would contribute less than a threshold amount of volume to the output audio signal;
      receive frequency samples of the second plurality of frequency samples that are less than the threshold frequency;
      perform a convolution, from the lowest frequency to the threshold frequency, on frequency samples from the first plurality of frequency samples with frequency samples from the second plurality of frequency samples; and
      generate the output audio signal based on a result of the convolution.

16. The computing device of claim 15, wherein the threshold frequency comprises a second threshold frequency, and wherein the computer-executable instructions further cause the audio processing device to:
   identify a first threshold frequency above which frequency samples of the first plurality of frequency samples would contribute less than a threshold amount of volume to the output audio signal;
   identify as a maximum frequency a minimum of the first threshold frequency and the second threshold frequency; and wherein the convolution is performed from the lowest frequency to the maximum threshold frequency.

17. The computing device of claim 16, wherein a frequency sample contributes less than the threshold amount of volume to the output audio signal when the frequency sample has an amplitude that is zero or within a defined threshold of zero.

18. The computing device of claim 15, wherein the impulse response block is one of a plurality of impulse response blocks, wherein the second threshold frequency is identified for each of the plurality of impulse response blocks, wherein the maximum threshold frequency is identified for each of the plurality of impulse response blocks, and wherein the convolution operation is performed on the audio signal block for each of the plurality of impulse response blocks.

19. The computing device of claim 18, wherein the second threshold frequencies identified for each of the plurality of response blocks are pre-computed and stored in a reduction table.

20. The computing device of claim 19, wherein the reduction table is copied from a main memory to the audio processing device before frequency samples of the plurality of impulse response blocks are copied to the audio processing device from the main memory.

* * * * *